United States Patent [19]
Lee et al.

[11] Patent Number: 5,598,371
[45] Date of Patent: Jan. 28, 1997

[54] DATA INPUT/OUTPUT SENSING CIRCUIT OF SEMICONDUCTOR MEMORY DEVICE

[75] Inventors: Ho-Cheol Lee, Seoul; Seung-Hun Lee, Suwon, both of Rep. of Korea

[73] Assignee: Samsung Electronics Co., Ltd., Suwon, Rep. of Korea

[21] Appl. No.: 565,292

[22] Filed: Nov. 30, 1995

[30]  Foreign Application Priority Data

Dec. 19, 1994 [KR] Rep. of Korea .................. 35014/1994

[51] Int. Cl.⁶ ....................................................... G11C 7/00
[52] U.S. Cl. .................... 365/189.05; 365/196; 365/190; 365/208; 326/24; 326/27; 326/28
[58] Field of Search ............................. 365/196, 189.05, 365/190, 208; 326/24, 27, 28

[56]  References Cited

U.S. PATENT DOCUMENTS 5,005,156  4/1991  Takai .................................. 365/189.05
5,067,109  11/1991  Kim et al. ......................... 365/189.05

*Primary Examiner*—David C. Nelms
*Assistant Examiner*—Andrew Q. Tran
*Attorney, Agent, or Firm*—Cushman Darby & Cushman IP Group of Pillsbury Madison & Sutro LLp

[57]  ABSTRACT

A data input/output sensing circuit of a semiconductor memory device including a plurality of memory cells, the circuit comprises: input/output lines of the memory cell; data input/output terminals connected to outside of the memory cells; a single data input/output line connected between the input/output lines and the data input/output terminals; a sensing unit for sensing whether or not effective data is provided in the data input/output lines to thereby generate a sensing signal; an output driving unit for transmitting data of the data input/output lines to the data input/output terminals in response to the sensing signal; and a writing driving unit for inputting data of the data input/output terminals in response to the sensing signal.

5 Claims, 9 Drawing Sheets

和,598,371

DATA INPUT/OUTPUT SENSING CIRCUIT OF SEMICONDUCTOR MEMORY DEVICE

BACKGROUND OF THE INVENTION

The present invention relates to a semiconductor memory device including a number of data input/output terminals, and more particularly, to a data input/output sensing circuit for controlling a data input/output line functioning as a data bus line within a memory chip.

Generally, semiconductor memory devices include a number of data input/output lines (hereinafter referred to as DIO lines) as internal data bus lines inputting and outputting data to/from the exterior of the memory chip device. There are two types of DIO lines. One is DIO lines used in pairs and the other is the use of single DIO lines.

When using DIO lines in pairs, logic circuits as shown in FIG. 1 through FIG. 4 are used. In this case, the number of the DIO lines is twice the number of data input/output terminals (hereinafter referred to as a DQ terminal) and usually the DIO lines have been precharged to a logic "high" state.

FIG. 1 is a circuit diagram illustrating the structure of a reading driving circuit which connects data read out from a memory cell array and provided on the input/output lines IO and IOB of the memory cell to the DIO lines DIO and DIOB. FIG. 2 is a circuit diagram illustrating the structure of an output driving circuit which outputs data provided to the DIO lines DIO and DIOB through the DQ terminal DQ. The input/output line IOB is complementary to the input/output line IO, and similarly the DIO line DIOB is complementary to the data input/output line DIO.

In FIG. 1, the DIO lines DIO and DIOB are precharged with a precharge signal PRECH of the logic "low" state. Assuming that data read out from the memory cell transmitted along the input/output line IO at the logic "high" state and to the input/output line IOB at the logic "low" state, it is then input to an I/O sense-amplifier 102. If an input/output sensing enable signal IOSE is enabled to the logic "high" state, MOS field effect transistors MOSFETs 114 and 122 are turned ON and MOSFETs 116 and 120 are turned OFF, thereby continuously maintaining the line DIO at the logic "high" state and changing the line DIOB, previously precharged to the logic "high" state, to the logic "low" state. Signals on the DIO lines DIO and DIOB are respectively applied to the lines in FIG. 2, and accordingly, the line DIO of FIG. 2 goes to the logic "high" state and the line DIOB goes to the logic "low" state. Then, if a read data transmitting pulse RDTP is enabled to the logic "high" state, a MOSFET 208 is turned ON and a MOSFET 210 is turned OFF according to the logic state of the DIO lines DIO and DIOB. Consequently, data output buffer 212 outputs data of the logic "high" state through the DQ terminal to the exterior of the memory device.

FIG. 3 is a circuit diagram illustrating the structure of an input driving circuit which connects data input through the DQ terminal DQ from the exterior of the memory device to the DIO lines DIO and DIOB. FIG. 4 is a circuit diagram illustrating the structure of a writing driving circuit which applies data provided in the DIO lines DIO and DIOB to the I/O lines IO and IOB to thereby write data in the memory cell. Assuming that DQ terminal is logic "high" state, in FIG. 3, if a writing data transmitting pulse WDTP is enabled to the logic "high" state, MOSFETs 308 and 316 are turned ON and MOSFETs 310 and 341 are turned OFF, so that the line DIO goes to the logic "high" state and DIOB to the logic "low" state. Signals of the DIO lines DIO and DIOB are respectively applied to the lines in FIG. 4, and accordingly, the line DIO goes to a logic "high" state and the line DIOB goes to the logic "low" state. Thereafter, if the data transmission control pulse DTCP is enabled to the logic "high" state, the MOSFETs 408 and 416 are turned ON and MOSFETs 410 and 414 are turned OFF according to the logic state of the DIO lines DIO and DIOB. Consequently, the I/O line IO goes to the logic "high" state and the I/O line IOB thereof goes to the logic "low" state, to thus write data having a "high" state in the memory cell.

When using single DIO lines, logic circuits as shown in FIG. 5 to FIG. 8 are used. In this case, the number of DQ terminals is equal to the number of DIO lines.

FIG. 5 is a circuit diagram illustrating the structure of a reading driving circuit which connects data provided in the IO lines IO and IOB of the memory cell to the line DIO. FIG. 6 is a circuit diagram illustrating the structure of an output driving circuit which outputs data provided to the line DIO through the DQ terminal DQ. Assume that data read out from the memory cell is input to the I/O line IO at the logic "high" state and to the I/O line IOB at the logic "low" state. In FIG. 5, if the input/output sensing enable signal IOSE is enabled to the logic "high" state, MOSFET 512 is turned ON and MOSFET 514 is turned OFF, and therefore the line DIO goes to the logic "high" state. Referring to FIG. 6, after the line DIO goes to the logic "high" state, if the read data transmitting pulse RDTP is enabled to the logic "high" state, MOSFET 610 is turned ON and MOSFET 612 is turned OFF. Consequently, data output buffer 614 outputs data of the logic "high" state through the DQ terminal DQ to the exterior of the memory device.

FIG. 7 is a circuit diagram illustrating the structure of the input driving circuit which connects data input through the DQ terminal DQ from the exterior of the memory device to the DIO line DIO. FIG. 8 is a circuit diagram illustrating the structure of the writing driving circuit which applies data provided in the DIO line DIO to the I/O lines IO and IOB to thereby write data in the memory cell. Assuming that the DQ terminal DQ is at the logic "high" state, in FIG. 7, if the writing data transmitting pulse WDTP is enabled to the logic "high" state, MOSFET 710 is turned ON and MOSFET 712 is turned OFF, and therefore the line DIO goes to the logic "high" state. Referring to FIG. 8, after the DIO line DIO goes to the logic "high" state, if the data transmission control pulse DTCP is enabled to the logic "high" state MOSFETs 812 and 818 are turned ON and MOSFETs 814 and 816 are turned OFF. Consequently, the I/O line IO goes to the logic "high" state and the I/O line IOB goes to the logic "low" state to thereby write data at the logic "high" state in the memory cell.

When using DIO lines in pairs, as described above, the number of the DIO line is twice the number of DQ terminals and the DIO lines have to be precharged to the logic "high" state. However, when using a single DIO line, because the DIO line is fully swung, a sense amplifier 502 and a driving FET 512 of FIG. 5 and a driving FET 710 of FIG. 7 have to have a size larger than sense amplifier 102, driving FETs 114 and 120 of FIG. 1 and driving FETs 308 and 314 of FIG. 3, which are used when the pairs of DIO lines are precharged.

However, in the conventional circuits as described above, timing of the DIO line data transmission, a read data transmitting pulse and a data transmission controlling pulse is critical in order to prevent non-effective data from being applied to the I/O lines or DQ terminal and can result in problems. More particularly, when using a single DIO line, since the DIO line is always in the logic "high" state or the logic "low" state, when compared with the case of using the DIO lines in pairs, the read data transmitting pulse RDTP or the data transmission control pulse DTCP has to be enabled after sensing whether or not data of the DIO line is an effective value. If the read data transmitting pulse RDTP or the data transmission control pulse DTCP is enabled prior to the DIO line, non-effective data is provided to the DQ terminal upon reading and to the I/O lines upon writing. This results in generation of speed loss to ensure that effective data is obtained.

However, using pairs of DIO lines also has disadvantages. As the number of the I/O terminals increases, the number of the DIO lines within the chip is increased in proportion to the number of the I/O terminals, thereby causing the layout of the semiconductor memory device to be bulky. Therefore, when using DIO lines in pairs, this results in design problems due to spare occupied on the layout by the pairs of DIO lines.

SUMMARY OF THE INVENTION

Accordingly, it is an object of the present invention to provide a data input/output sensing circuit of a semiconductor memory device which is capable of reducing the number of DIO lines without affecting a general operation.

It is another object of the present invention to provide a data input/output sensing circuit of a semiconductor memory device which is capable of reducing the number of the DIO lines and having a free timing margin among the DIO line, a read data transmitting pulse and data transmission control pulse.

To achieve these and other objects, a data input/output sensing circuit of a semiconductor memory device according to the present invention comprises: input/output lines of a plurality of memory cells; data input/output terminals connected to the outside of the memory cell; a single data input/output line connected between the input/output lines and the data input/output terminals; a sensing unit for sensing that effective data is transmitted to the data input/output lines to thereby generate a sensing signal; an output driving unit transmitting data of the data input/output lines to the data input/output terminals in response to the sensing signal; and a writing driving unit for inputting data of the data input/output terminals in response to the sensing signal.

BRIEF DESCRIPTION OF THE DRAWINGS

A more complete appreciation of the invention, and many of the attendant advantages thereof, will be readily apparent as the same becomes better understood by reference to the following detail description when considered in conjunction with the accompanying drawings in which like reference symbols indicate the same or similar components, wherein.

DETAILED DESCRIPTION OF THE PREFERRED EMBODIMENTS

In the following description, numerous specific details, such as a specific circuit structure, the logic state and so on, are set forth in order to provide a thorough understanding of the present invention. It will be understood by those skilled in the art that other embodiments of the present invention may be practiced without these specific details, or with alternative specific details.

Figure 10:
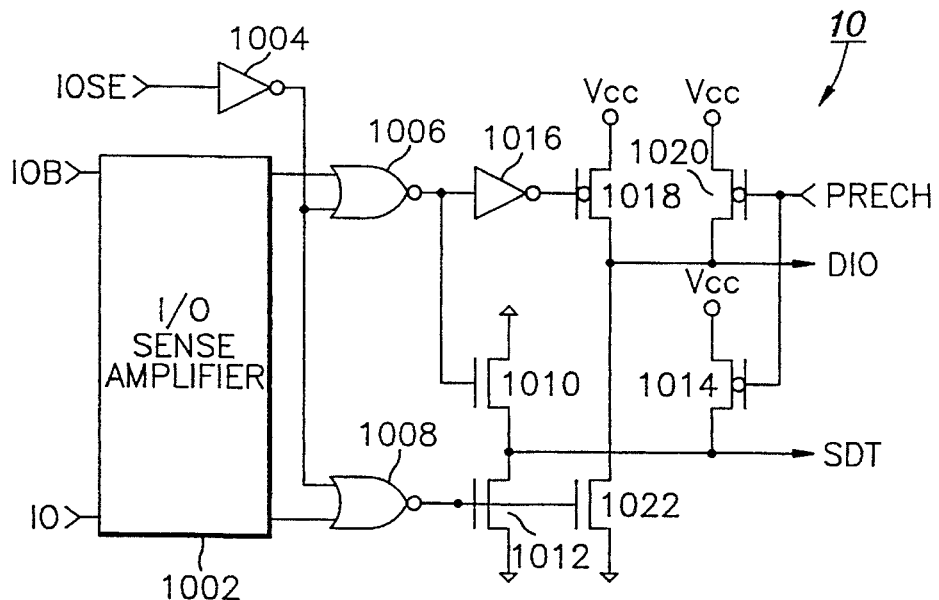
FIG. 10 is a circuit diagram illustrating a reading driving circuit of FIG. 9.
Figure 11:
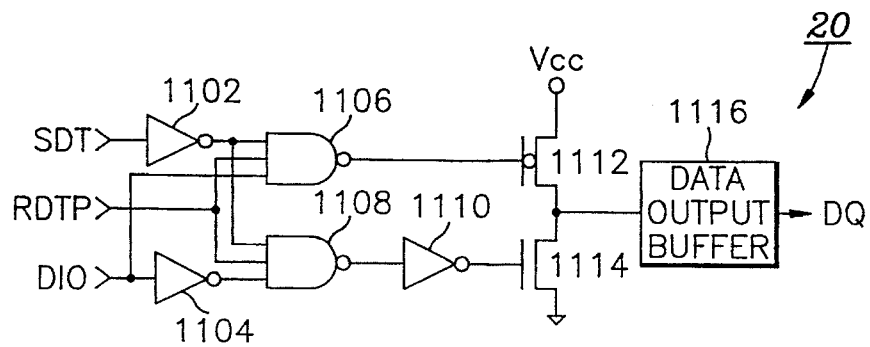
FIG. 11 is a circuit diagram illustrating an output driving circuit of FIG. 9.
Figure 9:
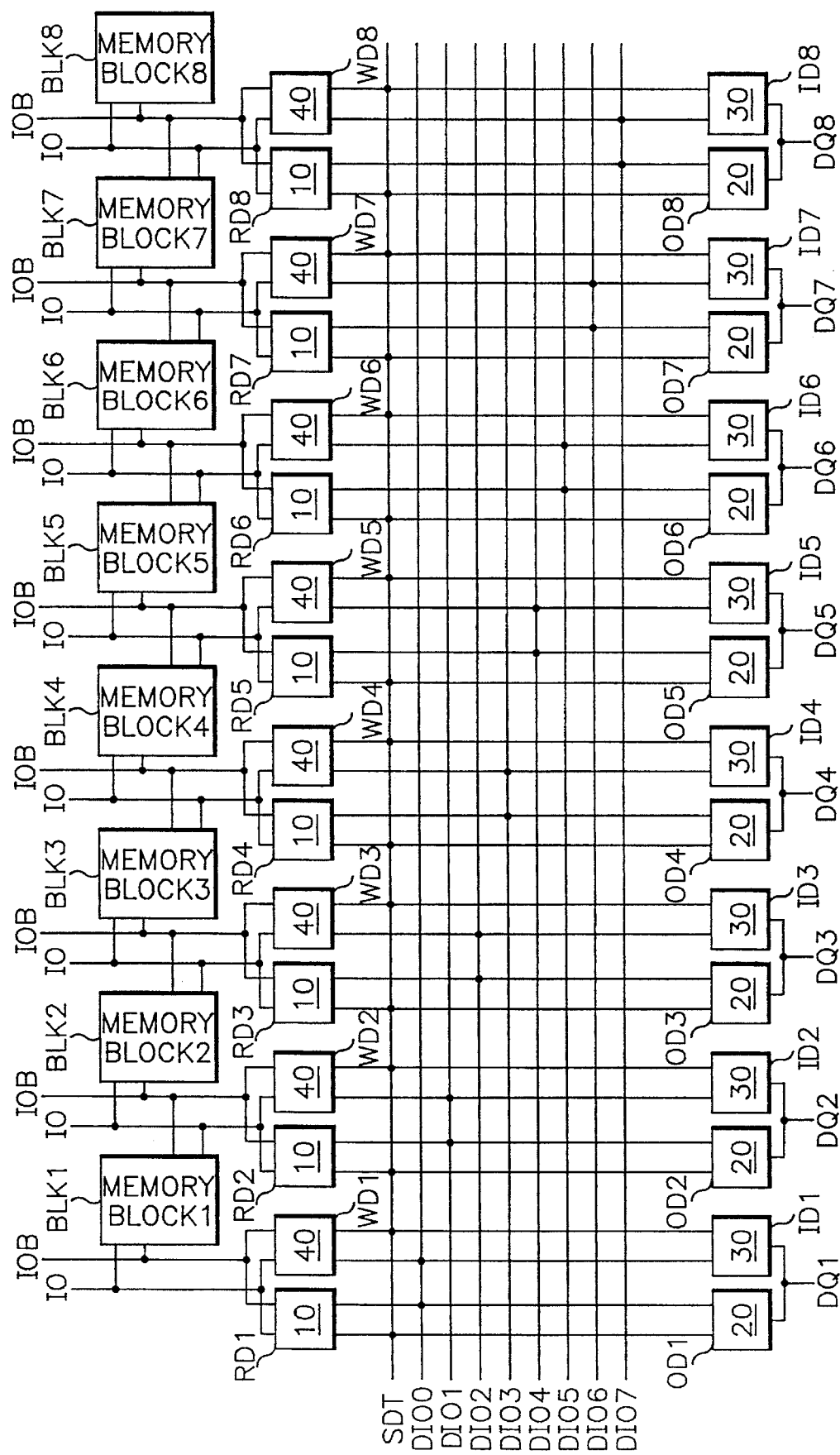
FIG. 9 is a circuit diagram illustrating a preferred embodiment of the present invention.
Figure 13:
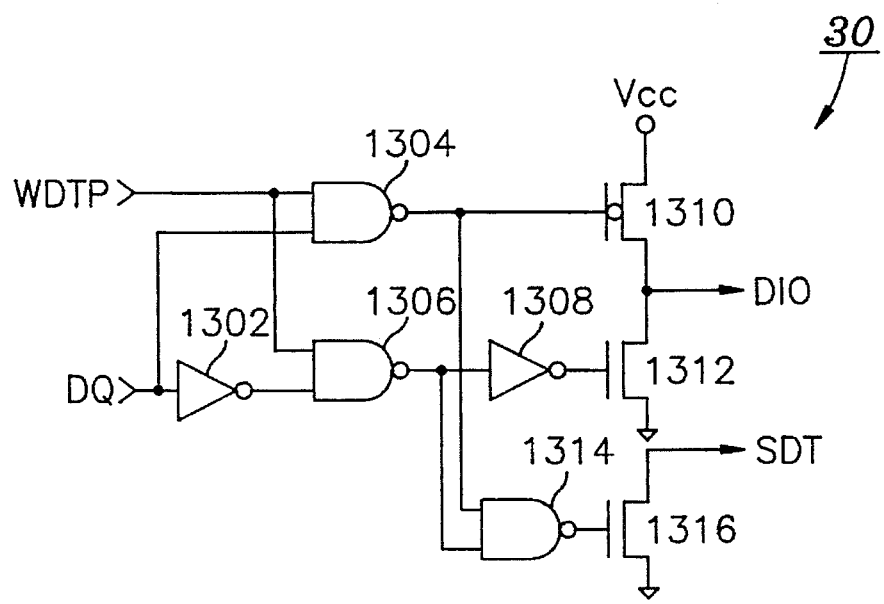
FIG. 13 is a circuit diagram illustrating an input driving circuit of FIG. 9.
Figure 14:
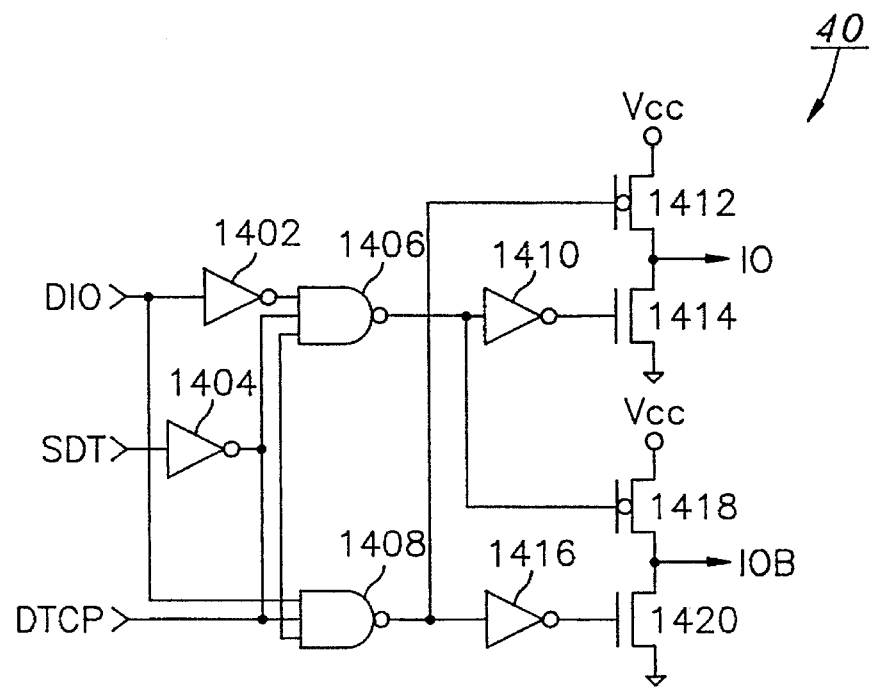
FIG. 14 is a circuit diagram illustrating a writing driving circuit of FIG. 9.

FIG. 9 is a circuit diagram illustrating a preferred embodiment according to the present invention in a semiconductor memory device, where 8 memory blocks BLK1–BLK8 are exemplified and arrangements of a number of DIO lines DIO0–DIO7 and a single line (hereinafter, referred to as a SDT) sensing input/output of data are illustrated. In FIG. 9, RD1–RD8 designates reading driving circuits constructed as shown in FIG. 10, OD1–OD8 designates output driving circuits constructed as shown in FIG. 11, ID1–ID8 designates input driving circuits constructed as shown in FIG. 13, and WD1–WD8 designates writing driving circuits constructed as shown in FIG. 14. Each of the I/O lines IO and IOB of the memory blocks RD1–RD8 is connected to the reading driving circuits RD1–RD8 and the writing driving circuits WD1–WD8 in common. Each of the output driving circuits OD1–OD8 is connected to correspond one-to-one to the reading driving circuits RD1–RD8 through each of the DIO lines DIO0–DIO7. Each of the input driving circuits ID1–ID8 is connected to correspond one-to-one to the writing driving circuits WD1–WD8 through each of the DIO lines DIO0–DIO7. Each terminal DQ is connected to one of the output driving circuits OD1–OD8 and one of the common input driving circuits ID1–ID8. Further, the SDT line is connected to the reading driving circuits RD1–RD8, the writing driving circuits WD1–WD8, the output driving circuits OD1–OD8, and the input driving circuits ID1–ID8 in common.

Accordingly, the SDT line is always operated even when a part of the reading driving circuits RD1–RD8 operate upon output data and a part of the input driving circuits ID1–ID8 upon input data. Therefore, in FIG. 9, the number of the transistors for driving the line DIO is equal to that of the transistors for driving the SDT line, by using circuits of the FIGS. 10 and 13. Further, in circuits as shown FIGS. 11 and 14, signals of the line DIO and the line SDT are combined to thereby be output. As a result, problems between the line DIO and the line SDT can be prevented because the two lines DIO and SDT are always operated together.

FIG. 10 is a circuit diagram illustrating the structure of reading driving circuits RD1–RD8 of FIG. 9. The I/O lines IO and IOB are respectively connected to one input terminal of NOR gates 1006 and 1008 through the sense amplifier 1002, and the input/output sensing enable signal IOSE is applied in common to the other input terminals of NOR gates 1006 and 1008. The output terminal of the NOR gate 1006 is connected to a gate terminal of an NMOS FET 1010 and simultaneously to a gate terminal of PMOS FET 1018 through an inverter 1016. The output terminal of the NOR gate 1008 is commonly connected to gate terminals of NMOS FETs 1012 and 1022. A source terminal and a drain terminal of FETs 1010 and 1012 are connected to the line SDT and a source terminal and a drain terminal of FETs 1018 and 1022 are connected to the line DIO. The line DIO and the line SDT are precharged by PMOS FETs 1020 and 1014 controlled with precharge signal PRECH.

FIG. 11 is a circuit diagram illustrating the structure of output driving circuits OD1–OD8 of FIG. 9. The line SDT is connected to one input terminal of NAND gates 1106 and 1108 through an inverter 1102, the line DIO is connected to another input terminal of NAND gate 1106 and simultaneously to another input terminal of the NAND gate 1108 through the inverter 1104, and the read data transmitting pulse RDTP is commonly applied to the other input terminals of NAND gates 1106 and 1108. The output terminal of the NAND gate 1106 is connected to a gate terminal of PMOS FET 1112, and the output terminal of the NAND gate 1108 to a gate terminal of the NMOS FET 1114. A source terminal and a drain terminal of FETs 1112 and 1114 are connected to an input terminal of a data output buffer 1116, and an output terminal of the data output buffer 1116 is connected to the DQ terminal DQ.

Figure 12:
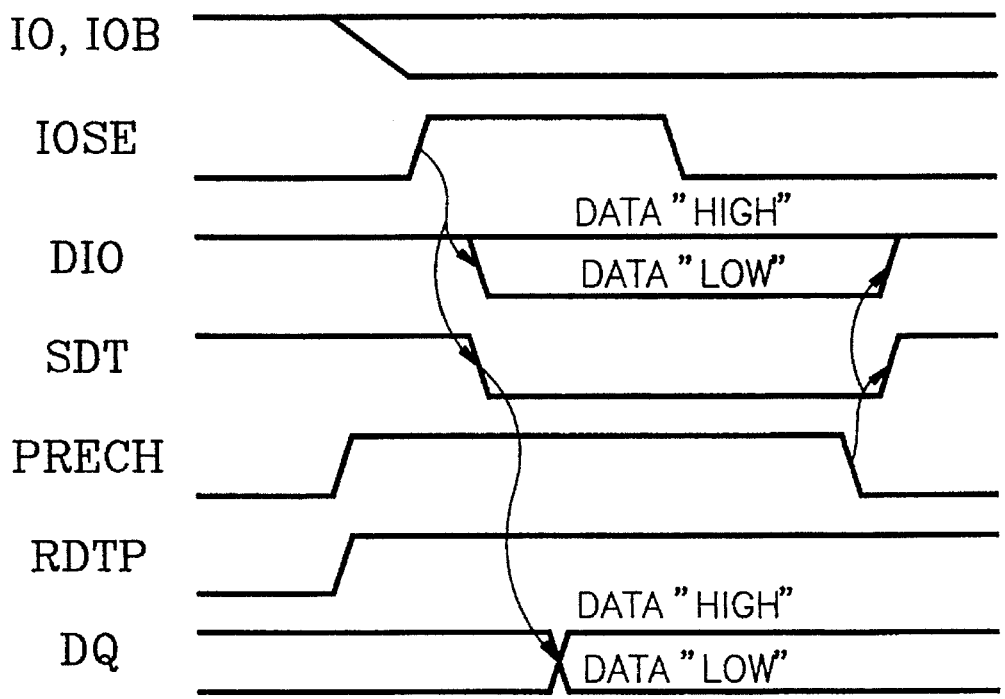
FIG. 12 is a timing diagram illustrating a reading operation according to the present invention.

FIG. 12 is a timing diagram illustrating operation of each component of FIGS. 10 and 11 when reading data from the memory cell.

An explanation of a reading operation according to the present invention will now be given with reference to FIG. 12.

Since the line DIO and the line SDT are not fully swung in accordance with the input/output of data, but always enabled from the logic "high" state to the logic "low" state, the initial values of the line DIO and the line SDT are at the logic "high" state. This is advantageous in reducing power supply noise, consumption electrical current, and size of layout.

Assume that the I/O line IO is at the logic "high" state and the I/O line IOB is at the logic "low" state when the read data transmitting pulse RDTP is at the logic "high" state as shown in FIG. 12. When the input/output sensing enable signal IOSE goes to the logic "high" state, the line SDT goes to the logic "low" state and the line DIO is maintained to the logic "high" state by the operations of FETs 1010 and 1018 shown in FIG. 10. Contrarily, assuming that the I/O line IO is at the "low" state and I/O line IOB is at the logic "high" state, the line SDT goes to the "low" state and the line DIO goes to the "low" state by operation of FETs 1012 and 1022. That is, the line SDT always goes to the low state irrespective the logic state of the I/O line IO, and the line DIO maintains the logic "high" state when the I/O line IO is at the logic "high" state and goes to the logic "low" state when the I/O line IO is at the logic "low" state.

If the line SDT goes to the logic "low" state and then the line DIO is at the logic "high" state, the FET 1112 shown in FIG. 11 operates so that DQ terminal DQ goes to the logic "high" state. If the line DIO goes to the logic "low" state, the FET 1114 operates so that the DQ terminal DQ goes to the logic "low" state. Further, if the DQ terminal of FIG. 11 is enabled, the precharge signal PRECH goes to the logic "low" state the input/output sensing enable signal IOSE has been at the logic "low" state, and therefore the line DIO and the line SDT are precharged to the logic "high" state to thereby stand-by for the next command.

FIG. 13 is a circuit diagram illustrating the structure of the input driving circuit ID1–ID8 of FIG. 9. The writing data transmitting pulse WDTP is applied to one input terminal of NAND gates 1304 and 1306, and the DQ terminal DQ is connected to the other input terminal of the NAND gate 1304 and connected to the other input terminal of the NAND gate 1306 through the inverter 1302. The output terminal of the NAND gate 1304 is connected to the gate terminal of the PMOS FET 1310 and one input terminal of the NAND gate 1314. The output terminal of the NAND gate 1306 is connected to the gate terminal of the NMOS FET 1312 through the inverter 1308 and to the other input terminal of the NAND gate 1314. The output terminal of the NAND gate 1314 is connected to the gate terminal of the NMOS FET 1316. Further, the source terminal and the drain terminal of FETs 1310 and 1312 are connected to the line DIO, and the drain terminal of the FET 1316 is connected to the line SDT.

FIG. 14 is a circuit diagram illustrating the structure of writing driving circuits WD1–WD8 of FIG. 9. The line DIO is connected to one input terminal of the NAND gate 1408 and to one input terminal of the NAND gate 1406 through the inverter 1402. The line SDT is connected to another input terminal of NAND gates 1406 and 1408 through the inverter 1404. The data transmission controlling signal DTCP is applied to the other input terminal of the NAND gates 1406 and 1408. The output terminal of the NAND gate 1406 is connected to the gate terminal of the PMOS FET 1418 and to the gate terminal of the NMOS FET 1414 through the inverter 1410. The output terminal of the NAND gate 1408 is connected to the gate terminal of the PMOS FET 1412 and to the gate terminal of the NMOS FET 1420 through the inverter 1416. Further, the source terminal and the drain terminal of FETs 1412 and 1414 are connected to the I/O line IO, and those of FETs 1418 and 1420 are connected to the I/O line IOB.

Figure 15:
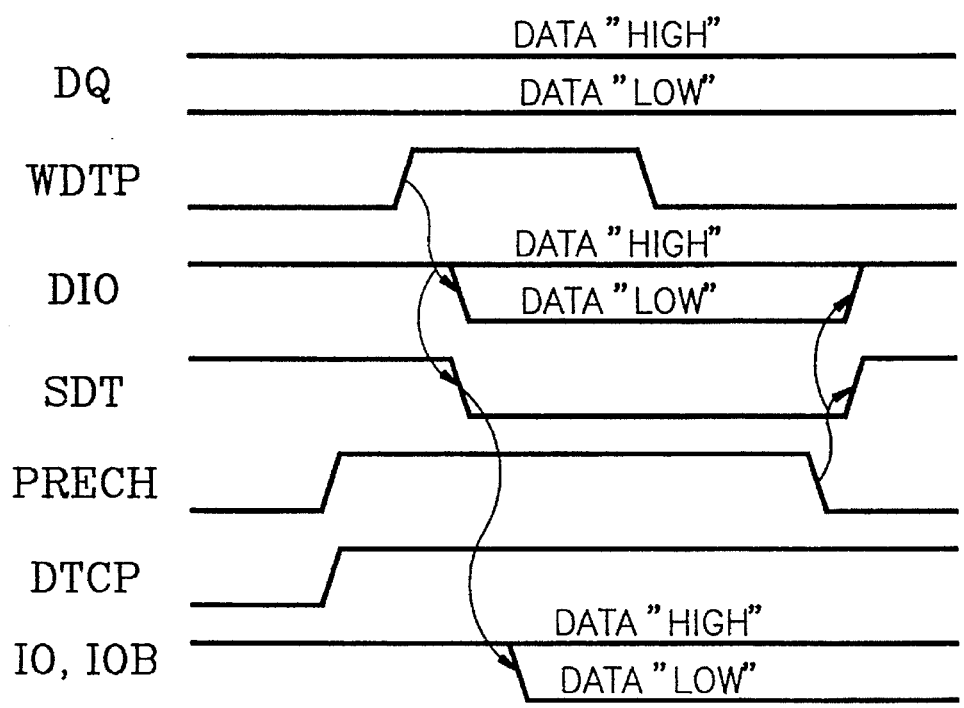
FIG. 15 is a timing diagram illustrating the writing operation according to the present invention.

FIG. 15 is a timing diagram illustrating the operation of each component of FIGS. 13 and 14 when writing data in the memory cell.

An explanation of writing operation according to the present invention will now be given in detail with reference to FIG. 15.

When the writing data transmitting pulse WDTP goes to the logic "high" state in the state that the data transmission control pulse DTCP and the precharge signal PRECH are at the logic "high" state as shown in FIG. 15, if the DQ terminal DQ is at the logic "high" state, FETs 1310 and 1316 operate so that the line SDT goes to the logic "low" state and line DIO maintains the logic "high" state. Contrarily, if the DQ terminal DQ is at the logic "low" state, FETs 1312 and 1316 operate so that the line SDT goes to the logic "low" state and the line DIO goes to the logic "low" state. That is, the line SDT always goes to the logic "low" state irrespective to the logic state of the DQ terminal DQ, and if the DQ terminal DQ is at the logic "high" state, the line DIO maintains the logic "high" state and if the DQ terminal DQ is at the low state, goes to the low state.

If the line SDT goes to the logic "low" state and then the line DIO is at the logic "high" state, FETs 1412 and 1420 operate so that the I/O line IO goes to the logic "high" state and the I/O line IOB goes to the logic "low" state, and contrarily, if the line DIO is at the logic "low" state, FETs 1414 and 1418 of FIG. 14 operate so that the I/O line IO goes to the logic "low" state and the I/O line IOB goes to the logic "high" state. Further, if the I/O lines IO and IOB of FIG. 14 are enabled, the precharge signal PRECH goes to the logic "low" state when the writing data transmitting pulse WDTP has been at the logic "low" state, and therefore the line DIO and the line SDT are precharged to the logic "high" state to thereby stand-by the next command.

In a memory device comprising a number of memory blocks, each memory block is generally not operated one by one but simultaneously in groups. For example, in the case where the memory device comprises 8 memory blocks BLK1–BLK8, they are divided into two groups of an odd memory block group (BLK1, BLK3, BLK5, BLK7) and an even memory block group (BLK2, BLK4, BLK6, BLK8). Thus, memory blocks within each group are simultaneously operated.

As described above, even when a part of reading driving circuits RD1–RD8 operate upon output data and a part of input driving circuits ID1–ID8 operate upon input data, the line SDT can always be operated.

Figure 1:
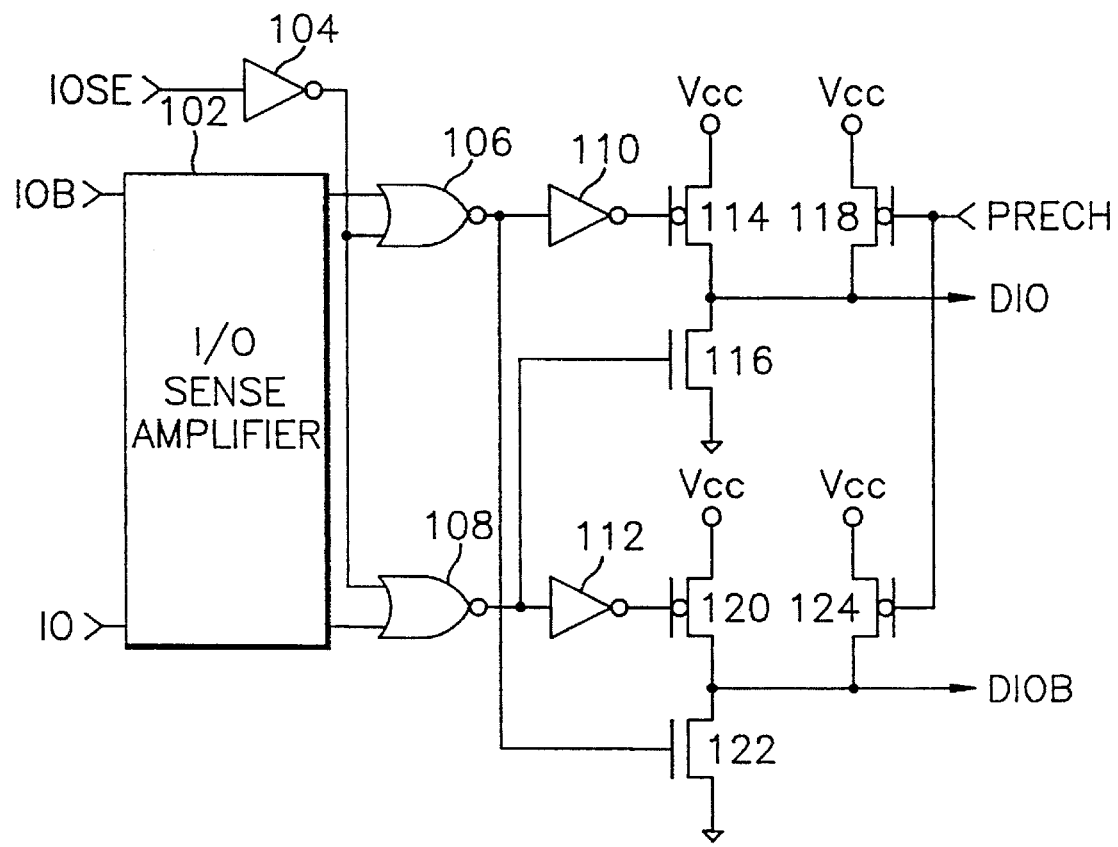
FIGS. 1 and 5 are circuit diagrams illustrating conventional reading driving circuits.
Figure 2:
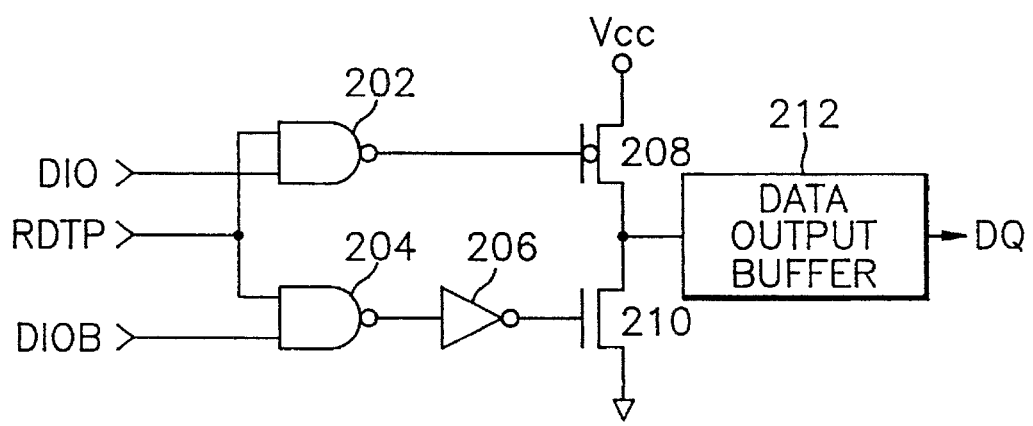
FIGS. 2 and 6 are circuit diagrams illustrating conventional output driving circuits.
Figure 3:
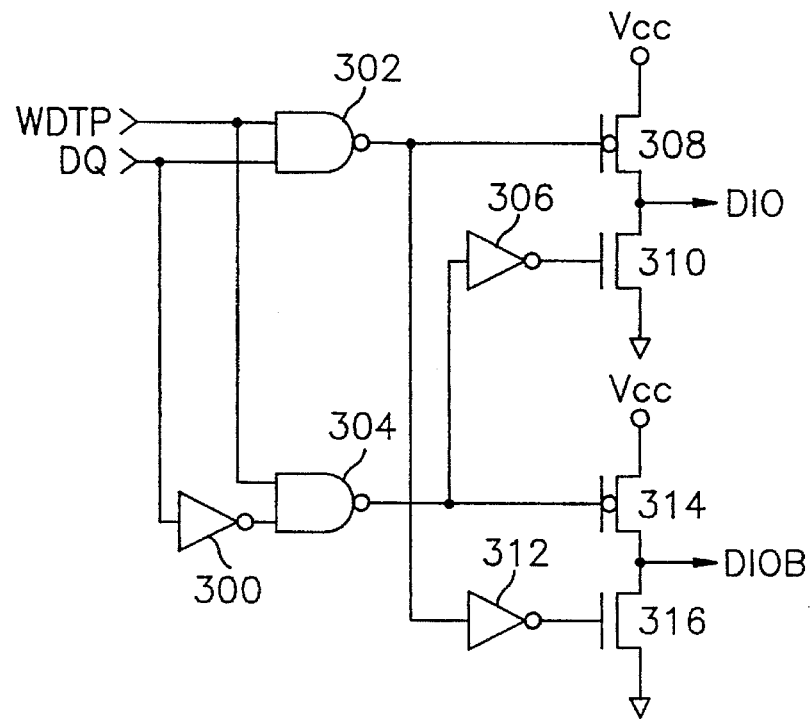
FIGS. 3 and 7 are circuit diagrams illustrating conventional input driving circuits.
Figure 4:
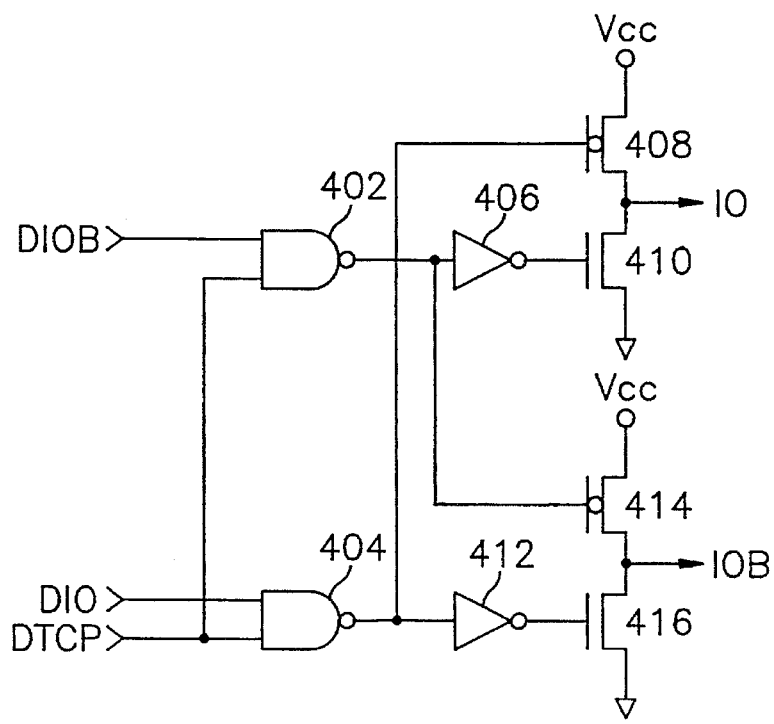
FIGS. 4 and 8 are circuit diagrams illustrating conventional writing driving circuits.
Figure 5:
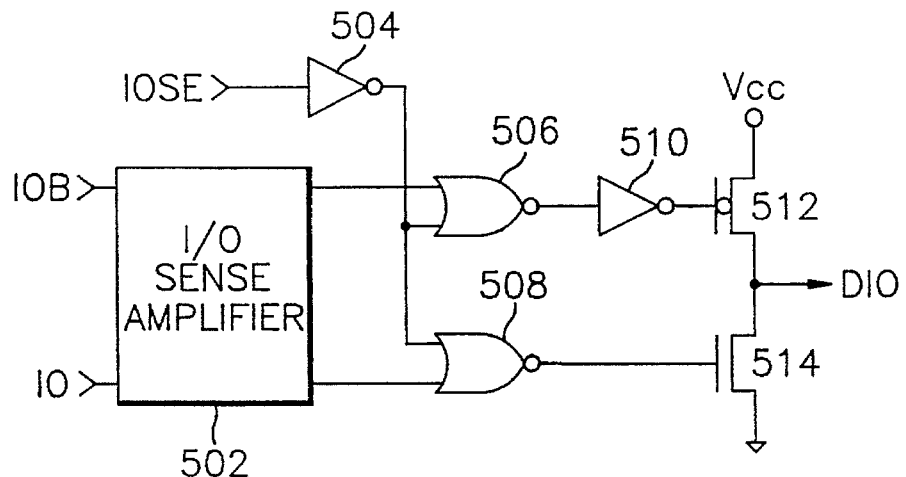
Figure 6:
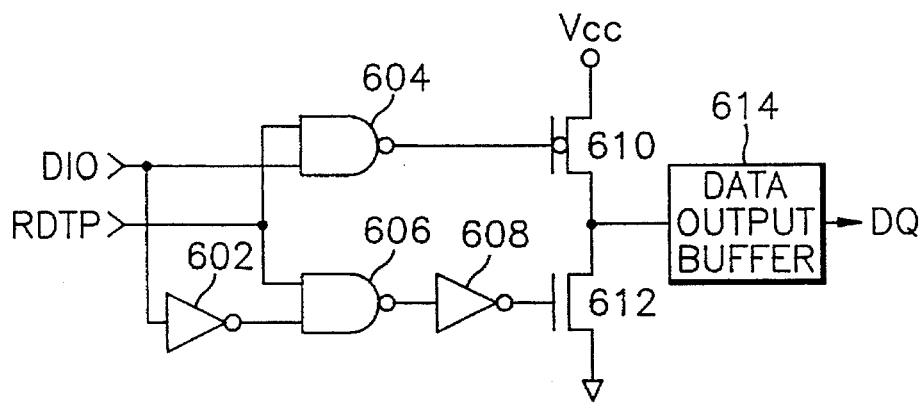
Figure 7:
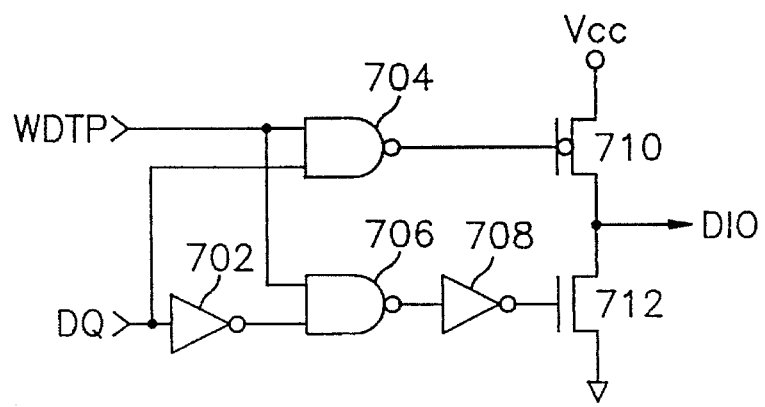
Figure 8:
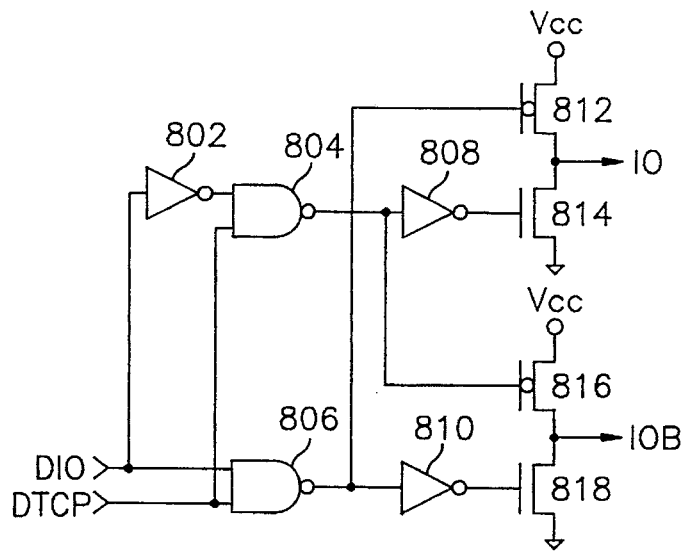
Figure 16:
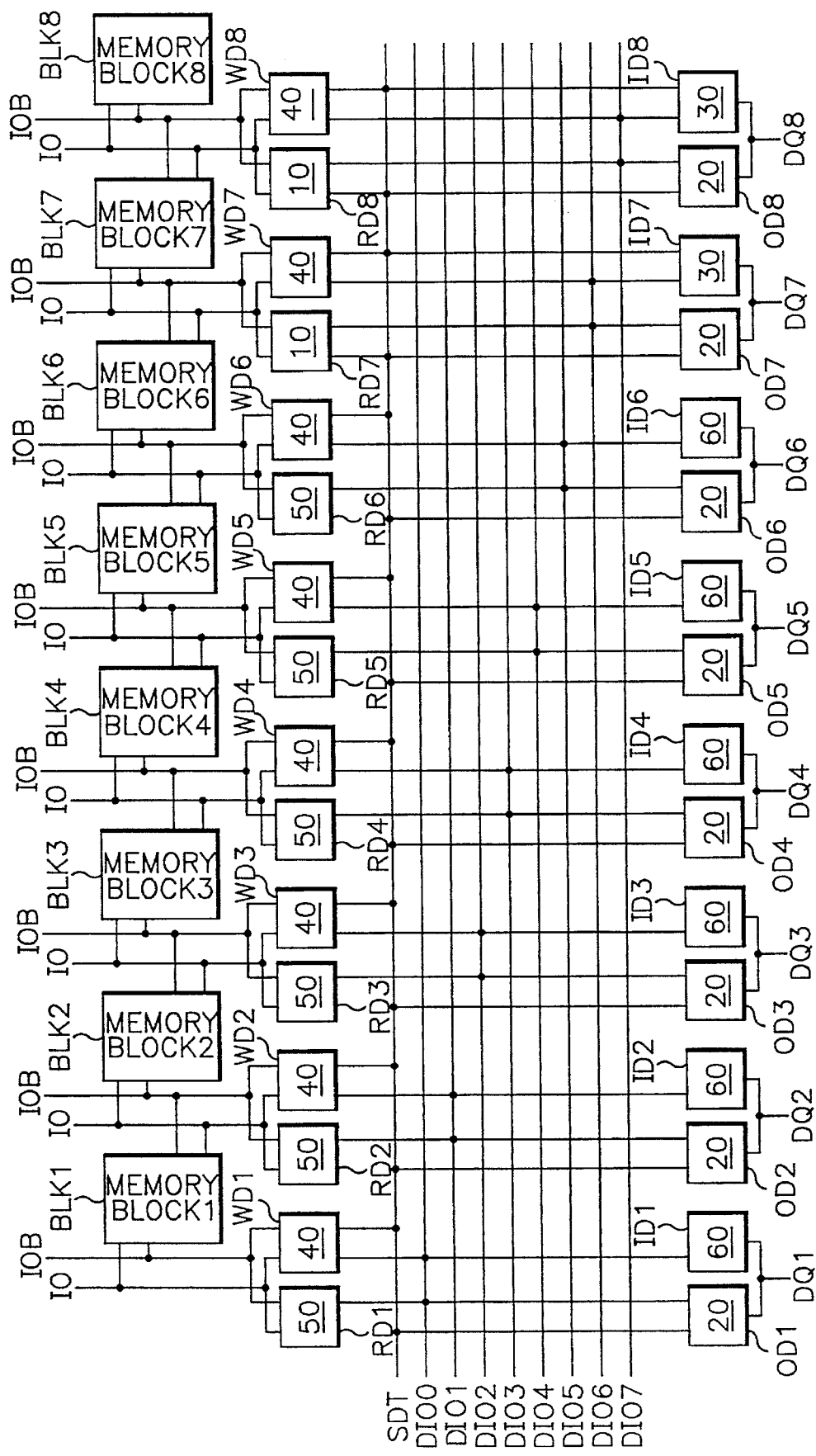
FIG. 16 is a block diagram illustrating another embodiment of the present invention.
Figure 17:
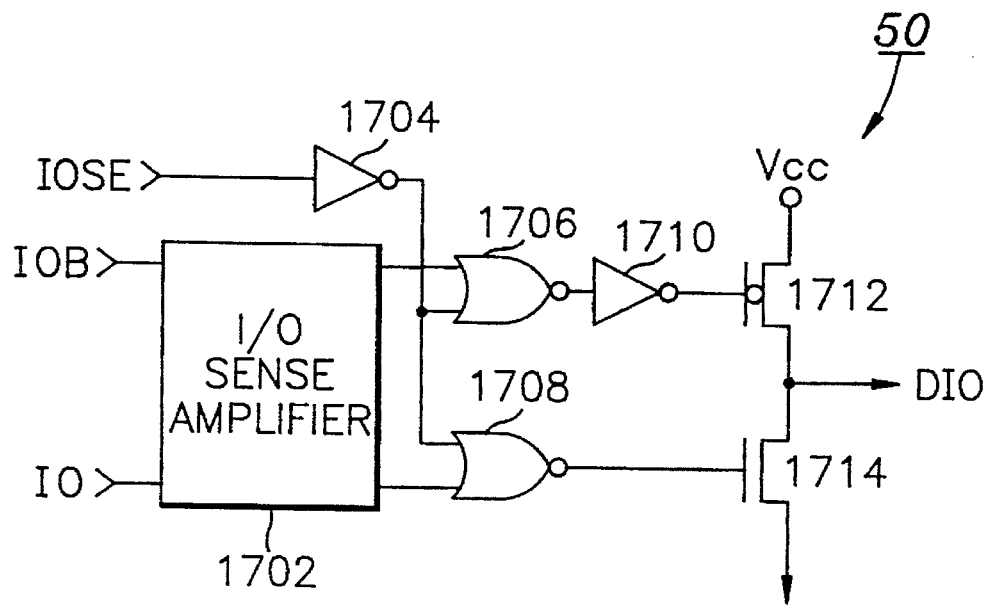
FIG. 17 is a circuit diagram illustrating a reading driving circuit of FIG. 16.
Figure 18:
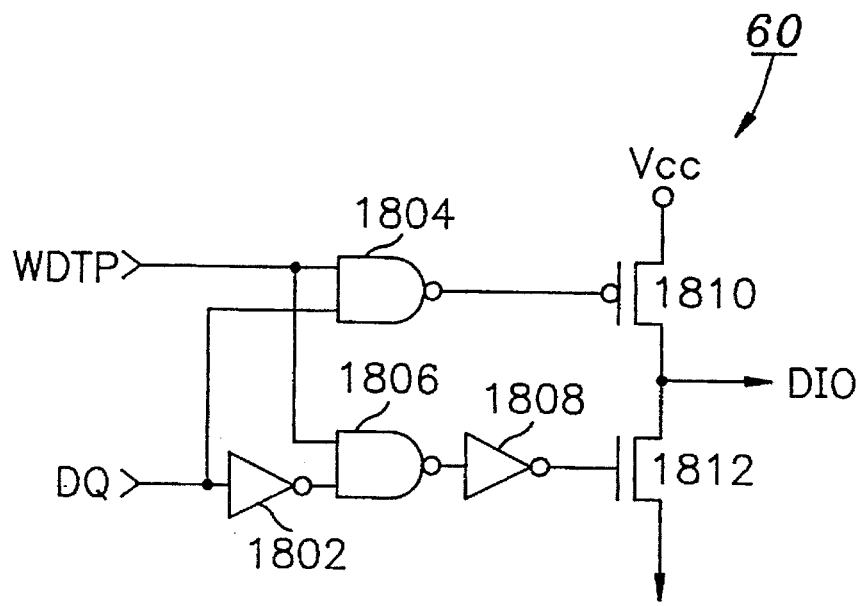
FIG. 18 is a circuit diagram illustrating a writing driving circuit of FIG. 16.

Therefore, even when certain of the reading driving circuits RD1–RD8 and input driving circuits ID1–ID8 (such as RD7–RD8 and ID7–ID8 in FIG. 16) are constructed as shown in FIGS. 10 and 11 and the others are constructed as shown in FIGS. 17 and 18, the present invention can be embodied. The reading driving circuits RD1–RD6 of FIG. 16 constructed as shown in FIG. 17 have the same structure as FIG. 5, whereas read driving circuits RD7 and RD8 are constructed as shown in FIG. 10. Further, the input driving circuits ID1–ID6 constructed as shown in FIG. 18 have the same structure as conventional FIG. 7, whereas input driving circuits ID7 and ID8 are constructed as shown in FIG. 13. That is, only one of reading driving circuits RD1–RD8 or input driving circuits ID1–ID8 is designed to drive the line SDT, among groups of the odd memory blocks (BLK1, BLK3, BLK5, BLK7) and even memory blocks (BLK2, BLK4, BLK6, BLK8). When the odd memory blocks BLK1, BLK3, BLK5, BLK7 operate, the line SDT is driven by operation of the reading driving circuit RD7-8 or the input driving circuit ID7-8, and when the even memory blocks BLK2, BLK4, BLK6, BLK8 operate, the line SDT is driven by operation of the reading driving circuit RD7-8 or the input driving circuit ID7-8.

Consequently, since the line SDT is always enabled whenever any one of reading driving circuits RD1–RD8 or any one of input driving circuits ID1–ID8 operates, the number of SDT line sensing circuits may be smaller than that of DIO line driving circuits, thereby making it possible to reduce the load of the line SDT used in many circuits.

As described above, the present invention has an advantage in that the number of the input/output line may be reduced without affecting conventional operation and there is no critical timing needed with the data input/output line, the read data transmitting pulse and data transmission control pulse in order to ensure proper operation.

While the present invention has been described with reference to a few specific embodiments, the description is illustrative of the invention and is not to be constructed as limiting the invention. Various modifications may occur to those skilled in the art without departing from the true spirit and scope of the invention as defined by the appended claims.

What is claimed is:

1. A data input/output sensing circuit of a semiconductor memory device including a plurality of memory cells, said circuit comprising:

input/output lines of said memory cells;

data input/output terminals connected to outside of said memory cells;

a single data input/output line connected between said input/output lines and said data input/output terminals;

sensing means for sensing whether or not effective data is provided in said data input/output lines to thereby generate a sensing signal;

output driving means for transmitting data of said data input/output lines to said data input/output terminals in response to said sensing signal; and writing driving means for inputting data of said data input/output terminals in response to said sensing signal.

2. A data input/output sensing circuit of a semiconductor memory device including a plurality of memory cells, said circuit comprising:

reading driving means for sense-amplifying data read out from input/output lines of said memory cells to thereby transmit said sense-amplified data to a single data input/output line;

sensing means for sensing whether or not effective data is provided in said data input/output lines to thereby generate a sensing signal; and output driving means for outputting data transmitted to said data input/output lines to outside of said -memory cells in response to said sensing signal.

3. A data input/output sensing circuit of a semiconductor memory device including a plurality of memory cells, said circuit comprising:

input driving means for amplifying data inputted to data input/output terminals from outside of said memory cells to thereby transmit said amplified data to a single data input/output line;

sensing means for sensing whether or not effective data is provided in said data input/output lines to thereby generate a sensing signal; and writing driving means for applying data provided in said data input/output lines to input/output lines of said memory cells to thereby write data in said memory cells in response to said sensing signal.

4. A data input/output sensing circuit of a semiconductor memory device including a plurality of memory cells, said circuit comprising:

a number of input/output lines of said memory cells;

a number of data input/output terminals connected to outside of said memory cells;

a single data input/output line connected to correspond one by one between said input/output lines and said data input/output terminals;

sensing means for sensing whether or not effective data is provided in said data input/output lines to thereby generate a sensing signal;

output driving means for transmitting data of said corresponding data input/output lines to said data input/output terminals in response to said sensing signal; and writing driving means for inputting data of said corresponding data input/output terminals in response to said sensing signal.

5. A data input/output sensing circuit of a semiconductor memory device including a plurality of memory cells, said circuit comprising:

a number of input/output lines of said memory cells;

a number of data input/output terminals connected to outside of said memory cells;

a single data input/output line connected to correspond one by one between said input/output lines and said data input/output terminals;

sensing means for sensing whether or not effective data is provided in one of said data input/output lines to thereby generate a sensing signal;

output driving means for transmitting data of said corresponding data input/output lines to said data input/output terminals in response to said sensing signal; and writing driving means for inputting data of said corresponding data input/output terminals in response to said sensing signal.

* * * * *